United States Patent
Koo et al.

(10) Patent No.: US 10,629,099 B2
(45) Date of Patent: Apr. 21, 2020

(54) FLEXIBLE DISPLAY PANEL AND METHOD OF MANUFACTURING THE SAME

(71) Applicant: SAMSUNG DISPLAY CO., LTD., Yongin-si, Gyeonggi-Do (KR)

(72) Inventors: Hyunwoo Koo, Hwaseong-si (KR); Taewoong Kim, Seongnam-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/259,264

(22) Filed: Jan. 28, 2019

(65) Prior Publication Data
US 2019/0236987 A1   Aug. 1, 2019

(30) Foreign Application Priority Data

Feb. 1, 2018 (KR) .................. 10-2018-0013036

(51) Int. Cl.
*G09F 9/30* (2006.01)
*G06F 1/16* (2006.01)
*H01L 51/00* (2006.01)
*H01L 27/32* (2006.01)

(52) U.S. Cl.
CPC ............ *G09F 9/301* (2013.01); *G06F 1/1652* (2013.01); *H01L 51/0096* (2013.01); *H01L 51/0097* (2013.01); *H01L 27/3276* (2013.01)

(58) Field of Classification Search
CPC ....... G09F 9/301; H01L 51/0096–0097; H01L 23/4985; G06F 1/1652
See application file for complete search history.

(56) References Cited

U.S. PATENT DOCUMENTS

| | | | |
|---|---|---|---|
| 9,001,517 B2 * | 4/2015 | Hong | H01B 13/00 174/255 |
| 9,252,346 B2 * | 2/2016 | Rhee | H01L 33/62 |
| 2013/0092426 A1 * | 4/2013 | Wu | H01L 24/29 174/257 |
| 2016/0105950 A1 | 4/2016 | Drzaic et al. | |
| 2016/0190392 A1 * | 6/2016 | Kuraoka | H01L 33/08 257/13 |

FOREIGN PATENT DOCUMENTS

KR   10-1678162   11/2016
WO   WO-2017003098 A1 *  1/2017  ........... H01L 23/498

* cited by examiner

*Primary Examiner* — Mariceli Santiago
(74) *Attorney, Agent, or Firm* — F. Chau & Associates, LLC

(57) ABSTRACT

A flexible display panel includes a flexible substrate including a first region configured to receive a first stress and a second region configured to receive a second stress less than the first stress. The second region is located in a first direction from the first region. The flexible substrate further includes a conductive layer including a columnar conductive portion and a polycrystalline conductive portion. The columnar conductive portion is disposed on the first region of the flexible substrate and includes conductive columns, and the polycrystalline conductive portion is disposed on the second region of the flexible substrate and includes polycrystalline particles.

14 Claims, 16 Drawing Sheets

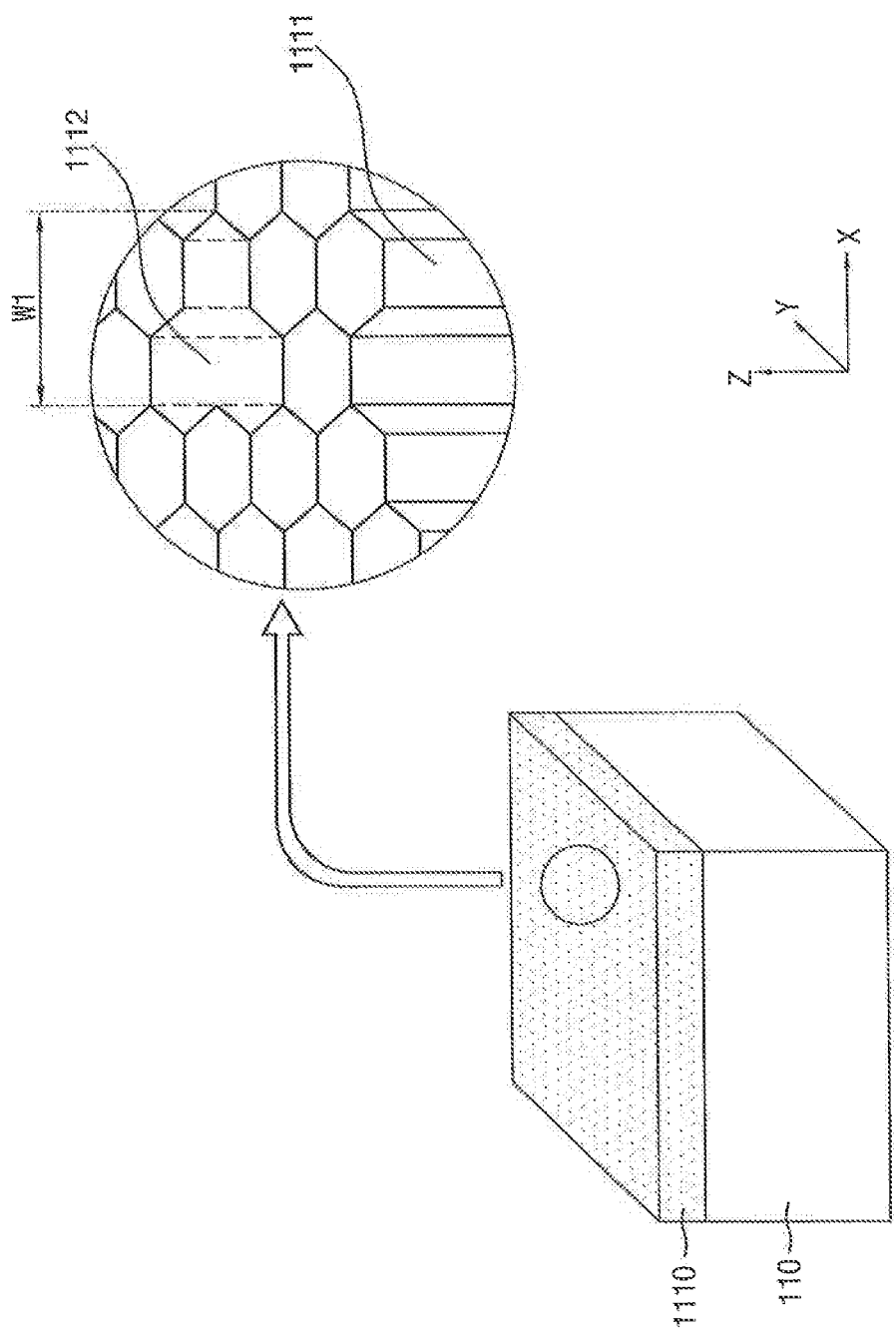

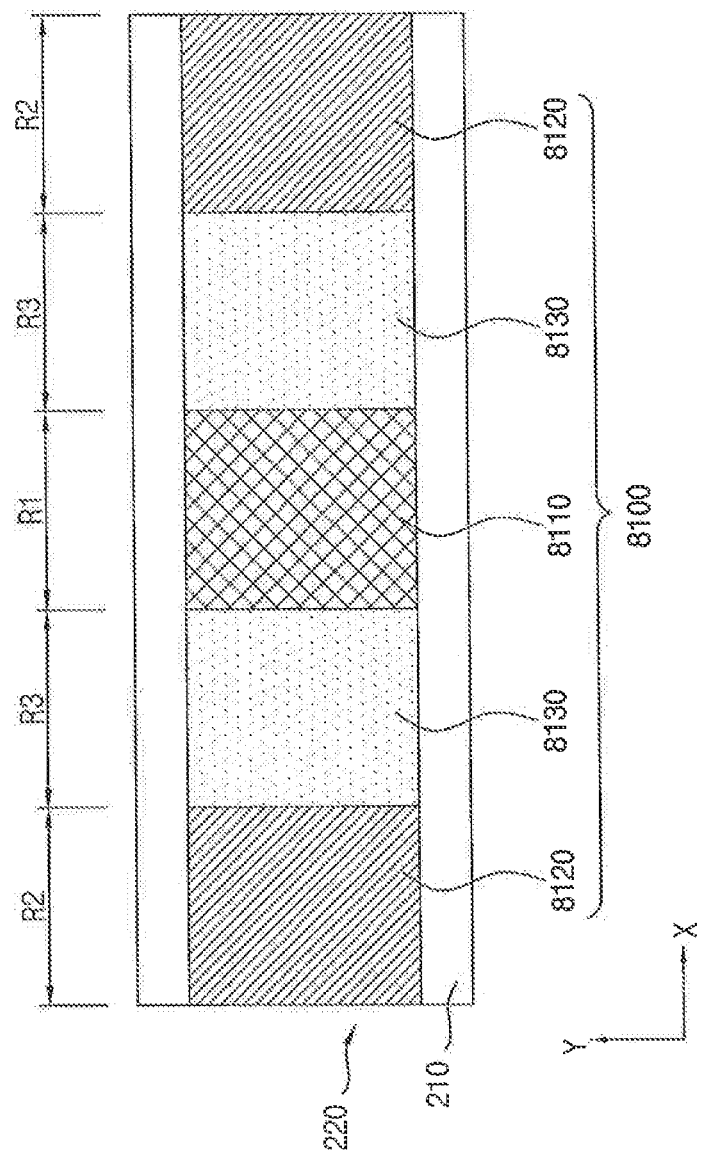

FLEXIBLE DISPLAY PANEL AND METHOD OF MANUFACTURING THE SAME

CROSS-REFERENCE TO RELATED APPLICATION(S)

This application claims priority under 35 U.S.C. § 119 to Korean Patent Application No. 10-2018-0013036, filed on Feb. 1, 2018 in the Korean Intellectual Property Office (KIPO), the disclosure of which is incorporated by reference herein in its entirety.

TECHNICAL FIELD

Exemplary embodiments of the present invention relate to a display device. More particularly, exemplary embodiments of the present invention relate to a flexible display panel and a method of manufacturing the flexible display panel.

DISCUSSION OF THE RELATED ART

Flexible display panels using flexible plastic films instead of rigid glass substrates are currently under development. Flexible display panels may be included in various kinds of display devices such as rollable display devices, bendable display devices, stretchable display devices, or the like.

Wirings for transmitting electric signals may be disposed on the flexible display panel. Stress may be applied to the wirings when the flexible display panel is rolled, bent, or stretched, and the wirings may be cracked or lifted from the flexible display panel due to the applied stress.

SUMMARY

According to an exemplary embodiment of the present invention, a flexible display panel includes a flexible substrate including a first region configured to receive a first stress and a second region configured to receive a second stress less than the first stress. The second region is located in a first direction from the first region. The flexible substrate further includes a conductive layer including a columnar conductive portion and a polycrystalline conductive portion. The columnar conductive portion is disposed on the first region of the flexible substrate and includes conductive columns, and the polycrystalline conductive portion is disposed on the second region of the flexible substrate and includes polycrystalline particles.

In an exemplary embodiment of the present invention, the flexible substrate further includes a third region configured to receive a third stress less than the first stress and greater than the second stress. The third region is located between the first region and the second region, and the columnar conductive portion and the polycrystalline conductive portion are in contact with each other on the third region of the flexible substrate. The columnar conductive portion is configured to receive the polycrystalline conductive portion, and the polycrystalline conductive portion is configured to receive the columnar conductive portion.

In an exemplary embodiment of the present invention, a concave-convex pattern of the columnar conductive portion protrudes in the first direction on the third region, and a concave-convex pattern of the polycrystalline conductive portion protrudes in a direction opposite to the first direction and toward the columnar conductive portion on the third region.

In an exemplary embodiment of the present invention, the flexible substrate further includes a third region configured to receive a third stress less than the first stress and greater than the second stress. The third region is located between the first region and the second region, and the conductive layer further includes a hybrid conductive portion disposed on the third region of the flexible substrate. The hybrid conductive portion includes conductive columns and polycrystalline particles.

In an exemplary embodiment of the present invention, a density of the conductive columns of the hybrid conductive portion decreases along the first direction, and a density of the polycrystalline particles of the hybrid conductive portion increases along the first direction.

In an exemplary embodiment of the present invention, the second stress is less than a critical stress of the polycrystalline conductive portion.

In an exemplary embodiment of the present invention, the conductive layer includes a metal having a face centered cubic (FCC) crystal structure.

In an exemplary embodiment of the present invention, the flexible display panel further includes a first auxiliary conductive layer disposed between the flexible substrate and the conductive layer, and a second auxiliary conductive layer disposed on the conductive layer.

According to an exemplary embodiment of the present invention, a flexible display panel includes a flexible substrate, a conductive layer disposed on the flexible substrate and including a plurality of columnar conductive portions and a plurality of polycrystalline conductive portions. Each of the plurality of columnar conductive portions includes conductive columns, and each of the plurality of polycrystalline conductive portions includes polycrystalline particles. The plurality of columnar conductive portions and the plurality of polycrystalline conductive portions are alternately arranged.

In an exemplary embodiment of the present invention, the plurality of columnar conductive portions and the plurality of polycrystalline conductive portions are alternately arranged along a first direction. The first direction extends along a length of the flexible substrate.

In an exemplary embodiment of the present invention, the plurality of columnar conductive portions and the plurality of polycrystalline conductive portions are alternately arranged along a second direction. The second direction extends along a width of the flexible substrate.

In an exemplary embodiment of the present invention, a width of each columnar conductive portion of the plurality of columnar conductive portions is substantially the same as a width of each polycrystalline conductive portion of the plurality of polycrystalline conductive portions.

In an exemplary embodiment of the present invention, a width of each columnar conductive portion of the plurality of columnar conductive portions is different from a width of each polycrystalline conductive portion of the plurality of polycrystalline conductive portions.

In an exemplary embodiment of the present invention, the conductive layer includes a first sub-conductive layer disposed on the flexible substrate and a second sub-conductive layer disposed on the first sub-conductive layer.

According to an exemplary embodiment of the present invention, a method of manufacturing a flexible display panel including forming a columnar conductive portion including conductive columns on a first region of a flexible substrate by applying a first power, and forming a polycrystalline conductive portion including polycrystalline particles on a second region of the flexible substrate by applying a second power greater than the first power.

In an exemplary embodiment of the present invention, a first stress is applied to the first region of the flexible substrate. A second stress less than the first stress is applied to the second region of the flexible substrate.

In an exemplary embodiment of the present invention, the first region and the second region of the flexible substrate are in contact with each other.

In an exemplary embodiment of the present invention, the method further includes forming a hybrid conductive portion including conductive columns and polycrystalline particles on a third region located between the first region and the second region of the flexible substrate by applying a third power greater than the first power and less than the second power.

In an exemplary embodiment of the present invention, the flexible substrate further includes a plurality of first regions and a plurality of second regions, and the plurality of first regions and the plurality of second regions are alternately arranged.

In an exemplary embodiment of the present invention, forming the columnar conductive portion includes forming a first sub-columnar conductive portion on the first region of the flexible substrate, and forming a second sub-columnar conductive portion on the first sub-columnar conductive portion. Forming the polycrystalline conductive portion includes forming a first sub-polycrystalline conductive portion on the second region of the flexible substrate, and forming a second sub-polycrystalline conductive portion on the first sub-polycrystalline conductive portion.

BRIEF DESCRIPTION OF THE DRAWINGS

The above and other features of the present invention will become more apparent by describing in detail exemplary embodiments thereof, with reference to the accompanying drawings, in which:

FIGS. 4A and 4B are perspective views illustrating a columnar conductive portion in FIG. 3 according to an exemplary embodiment of the present invention;

FIG. 15 is a plan view illustrating a flexible display panel according to an exemplary embodiment of the present invention.

DETAILED DESCRIPTION OF THE EMBODIMENTS

Hereinafter, exemplary embodiments of the present invention will be described more fully with reference to the accompanying drawings.

Figure 1A:
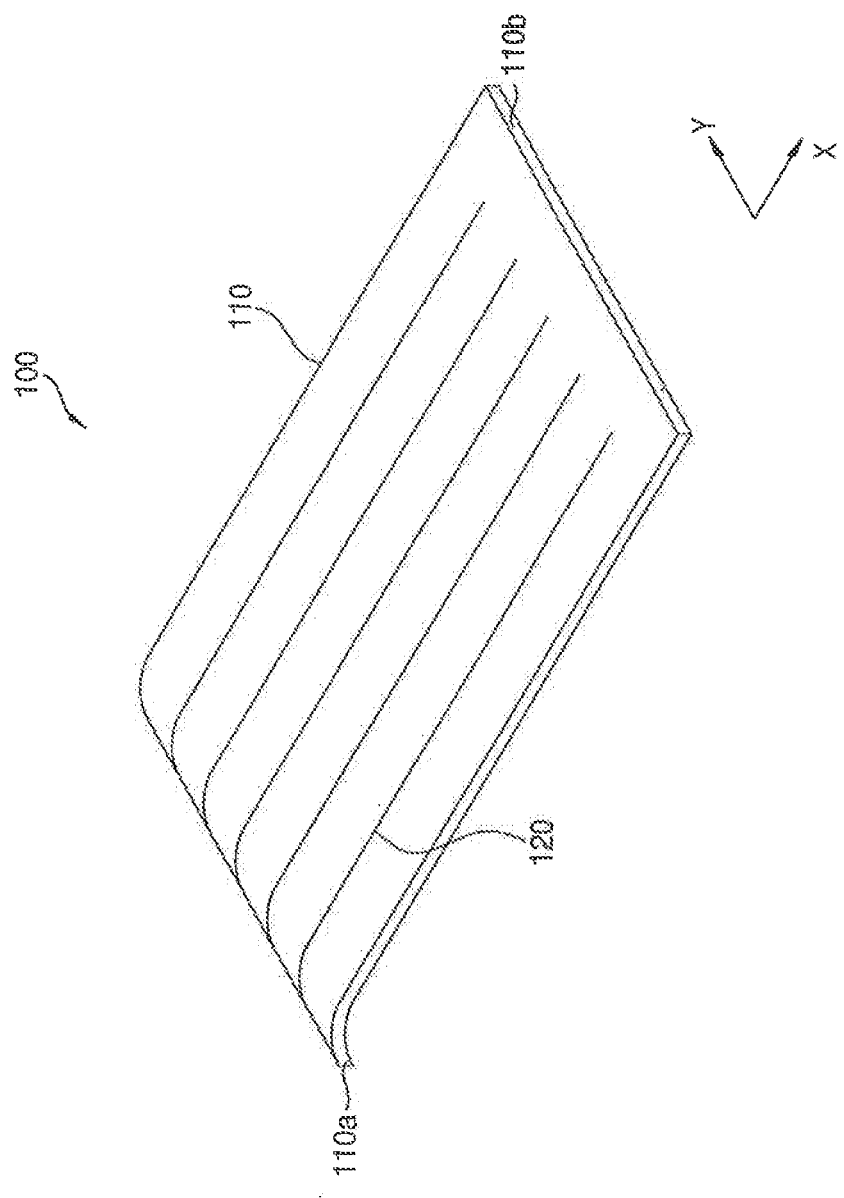
FIGS. 1A and 1B are perspective views illustrating a rollable display device including a flexible display panel according to an exemplary embodiment of the present invention.
Figure 1B:
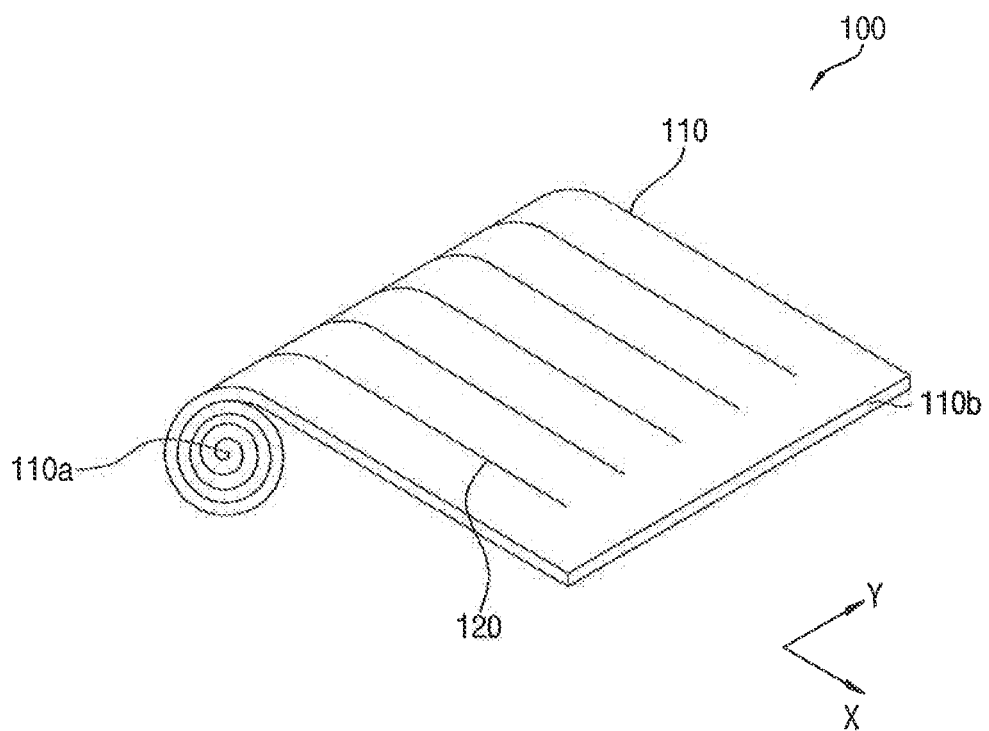

FIGS. 1A and 1B are perspective views illustrating a rollable display device including a flexible display panel according to an exemplary embodiment of the present invention. FIG. 1A illustrates the flexible display panel in an unrolled state, and FIG. 1B illustrates the flexible display panel in a rolled state.

Referring to FIGS. 1A and 1B, a flexible display panel 100 according to an exemplary embodiment of the present invention may include a flexible substrate 110 and a wiring 120 disposed on the flexible substrate 110. The flexible display panel 100 may display an image. The wiring 120 may extend in a first direction (X direction). For example, the wiring 120 may extend in a length direction of the flexible substrate 110.

The flexible display panel 100 may be rolled around a rolling axis. In this case, the flexible display panel 100 may be included in a rollable display device. The rolling axis may be in parallel with the flexible substrate 110 and in parallel with a second direction (Y direction) perpendicular to the first direction (X direction). For example, the rolling axis may be in parallel with a width direction of the flexible substrate 110. The flexible substrate 110 may include a central portion 110a adjacent to the rolling axis and an outer portion 110b spaced apart from the rolling axis. When the flexible display panel 100 is rolled around the rolling axis, stress may be applied to the flexible display panel 100 and the wiring 120 in the first direction (X direction).

Figure 2:
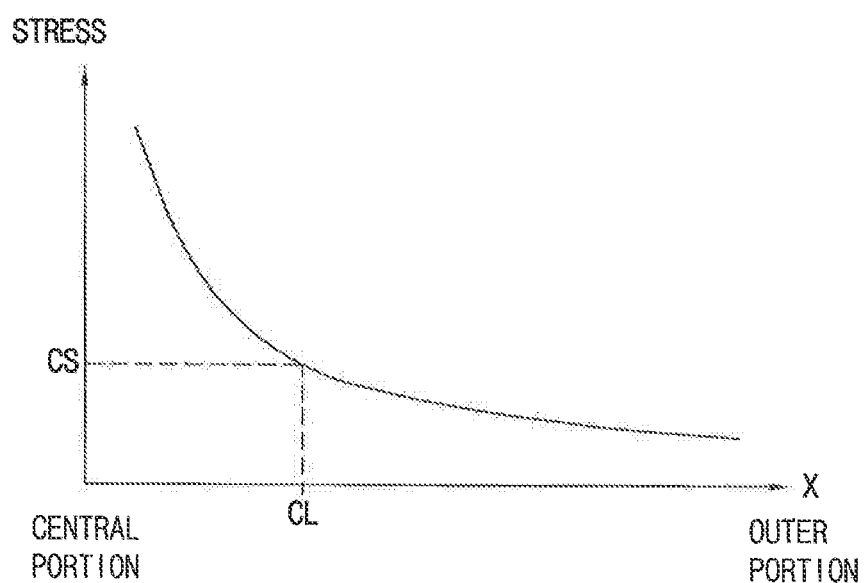
FIG. 2 is a graph illustrating a magnitude of stress applied to a wiring along a X direction in FIGS. 1A and 1B.

FIG. 2 is a graph illustrating a magnitude of stress applied to a wiring along a X direction in FIGS. 1A and 1B.

Referring to FIGS. 1A, 1B, and 2, stress may be applied to the wiring 120 in the first direction (X direction) when the flexible display panel 100 is rolled along the X direction. A magnitude of the stress applied to the wiring 120 may be different along the first direction (X direction). As illustrated in FIG. 2, the magnitude of the stress applied to the wiring 120 may decrease along the first direction (X direction). For example, the magnitude of the stress applied to the wiring 120 may increase as approaching the central portion 110a of the flexible substrate 110, and may decrease as approaching the outer portion 110b of the flexible substrate 110.

Hereinafter, planar structures of flexible display panels according to an exemplary embodiment will be described with reference to FIGS. 3, 5, 6, and 7.

Figure 3:
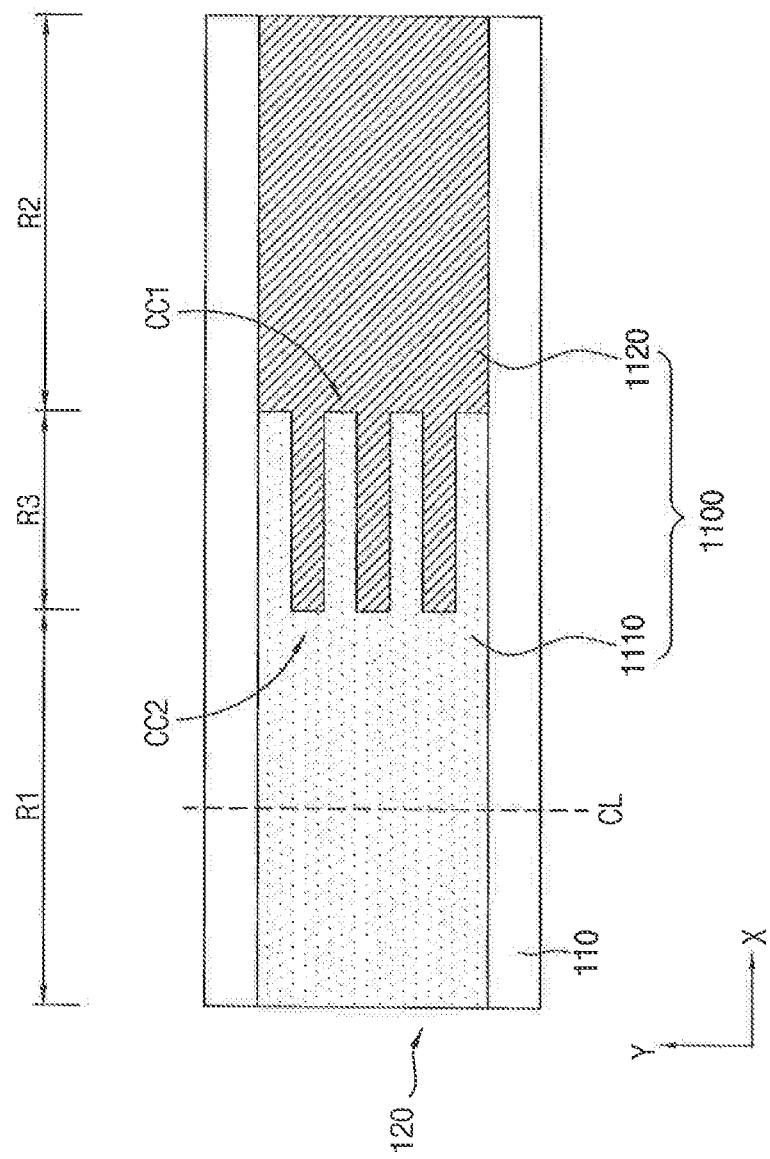
FIG. 3 is a plan view illustrating a flexible display panel according to an exemplary embodiment of the present invention.

FIG. 3 is a plan view illustrating a flexible display panel according to an exemplary embodiment of the present invention. FIG. 3 may illustrate a portion of the flexible display panel 100 in FIGS. 1A and 1B.

Referring to FIG. 3, the wiring 120 may include a conductive layer 1100 disposed on the flexible substrate 110.

The flexible substrate 110 may include a first region R1, a second region R2, and a third region R3. The first region R1, the second region R2 and the third region R3 may be arranged along the first direction (X direction). For example, the third region R3 may be located between the first region R1 and the second region R2. For example, the first region R1 may be adjacent to the central portion 110a of the flexible substrate 110, and the second region R2 may be adjacent to the outer portion 110b of the flexible substrate 110.

As described above, stress applied to the flexible substrate 110 may decrease as the outer portion 110b is approached from the central portion 110a along the first direction (X direction). For example, a first stress may be applied to the first region R1, and a second stress less than the first stress may be applied to the second region R2. Further, a third stress less than the first stress and greater than the second stress may be applied to the third region R3 between the first region R1 and second region R2.

The conductive layer 1100 may include a columnar conductive portion 1110 and a polycrystalline conductive portion 1120. The columnar conductive portion 1110 may be disposed on the first region R1 of the flexible substrate 110, and the polycrystalline conductive portion 1120 may be disposed on the second region R2 of the flexible substrate 110. For example, the columnar conductive portion 1110 may extend from the first region R1 to the third region R3, and the polycrystalline conductive portion 1120 may extend from the second region R2 to the third region R3. In the third region R3, the polycrystalline conductive portion 1120 may receive the columnar conductive portion 1110.

In an exemplary embodiment of the present invention, the columnar conductive portion 1110 may be disposed in the first region R1 and might not extend into the second region R2, and the polycrystalline conductive portion 1120 may be disposed in the second region R2 and might not extend into the first region R1.

Figure 4B:
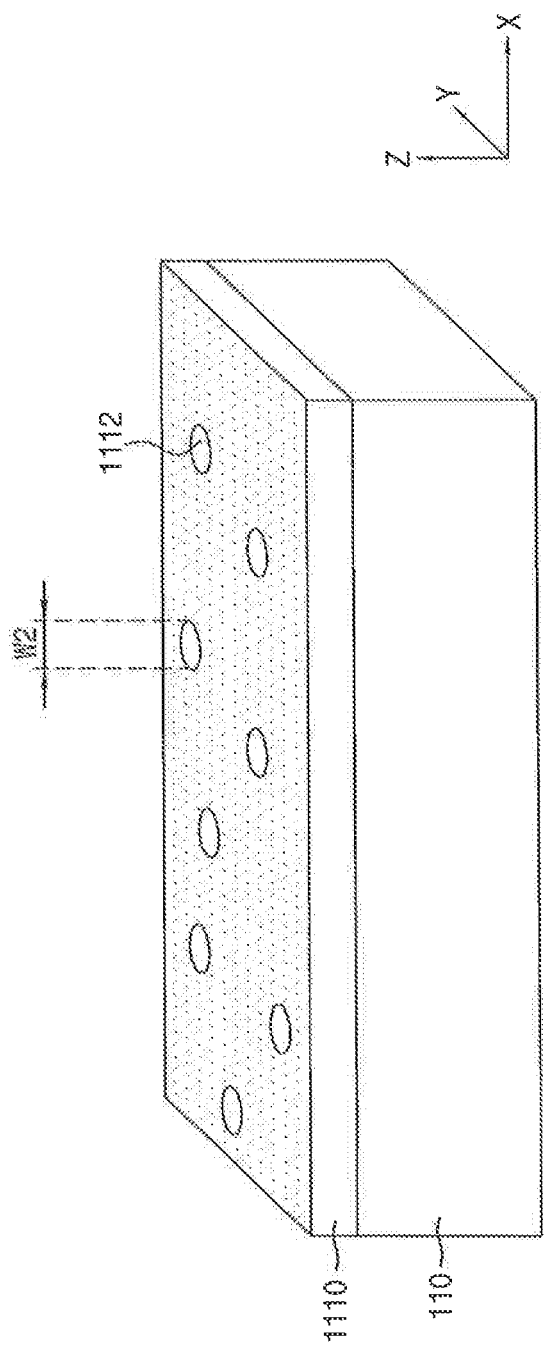

FIGS. 4A and 4B are perspective views illustrating a columnar conductive portion in FIG. 3 according to an exemplary embodiment of the present invention. FIG. 4A illustrates the columnar conductive portion to which stress is not applied, and FIG. 4B illustrates the columnar conductive portion to which stress is applied.

Referring to FIG. 4A, the columnar conductive portion 1110 may include a plurality of conductive columns 1111. The conductive columns 1111 may extend from an upper surface of the flexible substrate 110 along a third direction (Z direction) substantially perpendicular to the upper surface of the flexible substrate 110. However, the conductive columns 1111 may be tilted to one side to form a predetermined angle with respect to the upper surface of the flexible substrate 110. The conductive columns 1111 may have a columnar structure in which sidewalls may be connected with each other. The conductive columns 1111 may be adjacent to each other along the first direction (X direction) or the second direction (Y direction), and may be arranged in parallel with each other. For example, each conductive column 1111 may be in contact with one another. Therefore, a height of each of the conductive columns 1111 may be substantially the same as or similar to a height (or a thickness along the Z direction) of the columnar conductive portion 1110. In an exemplary embodiment of the present invention, an upper surface and/or a cross section in a horizontal direction of each of the conductive columns 1111 may be hexagonal, oval, or circular; however, the present invention is not limited thereto. For example, conductive columns 1111 may have any other polygonal shape.

The columnar conductive portion 1110 may further include a plurality of openings 1112. The openings 1112 may be spaces between adjacent conductive columns 1111 among the conductive columns 1111. The sidewalls of the conductive columns 1111 may be exposed by the openings 1112. Each of the openings 1112 may have a first width W1. As the conductive columns 1111 are arranged along the first direction (X direction) or the second direction (Y direction), the openings 1112 may also be arranged along the first direction (X direction) or the second direction (Y direction). Accordingly, heights of the openings 1112 may be similar to the heights of the conductive columns 1111. However, the present invention is not limited thereto, and the openings 1112 may hardly be formed as the conductive columns 1111 of the columnar conductive portion 1110 may be densely disposed.

Referring to FIG. 4B, a stretched columnar conductive portion 1110 including the conductive columns 1111 may be disposed on a stretched flexible substrate 110. Openings 1112 may be provided between the conductive columns 1111, and the stretched columnar conductive portion 1110 may have a conductive network structure in which the openings 1112 are dispersed. For example, the stretched columnar conductive portion 1110 may form a two-dimensional conductive network in which the openings 1112 may be dispersed in the first direction (X direction) or the second direction (Y direction) on the stretched flexible substrate 110.

Each of the openings 1112 may have a second width W2. Because widths W2 of the openings 1112 are extended on the stretched flexible substrate 110, more so than that of the openings 1112 on the flexible substrate 110 (e.g., in FIG. 4A), the second width W2 of each of the openings 1112 may be greater than the first width W1 of each of the openings 1112. Further, as the flexible substrate 110 is stretched, the sidewalls of the conductive columns 1111, which are in contact with each other, may be separated from each other, and new openings 1112 may be generated. Accordingly, the number of the openings 1112 in the stretched columnar conductive portion 1110 may increase from the number of the openings 1112 before stretching.

The conductive columns 1111 may rotate with an extending direction of the conductive columns 1111 as a rotating axis. For example, when the conductive columns 1111 are stretched, the conductive columns 1111 may rotate. Therefore, when the opening 1112 progresses or spreads in one direction in a space between the conductive columns 1111, the opening 1112 may be trapped, or a spreading direction of the opening 1112 may be changed by the stretching of the conductive columns 1111.

In general, when stress is applied to a flexible substrate on which a polycrystalline conductive portion is formed, a crack may spread in the polycrystalline conductive portion. For example, tensile stress may concentrate on a portion from which the crack starts, so that a more sharpened crack may be generated and may spread through the portion from which the crack starts. However, in the conductive columns 1111 of the columnar conductive portion 1110 according to an exemplary embodiment of the present invention, the opening 1112 may be trapped or the spreading direction of the opening 1112 may be easily changed by the movement of the conductive columns 1111. Accordingly, the columnar conductive portion 1110 may be more flexible than the polycrystalline conductive portion 1120.

Referring to FIG. 3 again, the polycrystalline conductive portion 1120 may include polycrystalline particles. The polycrystalline particles may not have a particular directional property. The polycrystalline conductive portion 1120 may have less resistivity than that of the columnar conductive portion 1110. For example, a resistivity of the polycrystalline conductive portion 1120 may be about 10 $\mu\Omega$·cm, and a resistivity of the columnar conductive portion 1110 may be about 15 $\mu\Omega$·cm. Accordingly, the resistance of the conductive layer 1100 may decrease because the conductive layer 1100 includes the polycrystalline conductive portion 1120 having the lower resistance.

The second stress applied to the second region R2 on which the polycrystalline conductive portion 1120 is disposed may be less than a critical stress CS of the polycrystalline conductive portion 1120. When stress greater than the critical stress CS is applied to the polycrystalline conductive portion 1120, the polycrystalline conductive portion 1120 may be cracked. The critical stress CS of the polycrystalline conductive portion 1120 may vary according to materials included in the conductive layer 1100. As illustrated in FIG. 2, the stress may decrease along X direction (from the central portion 110a to the outer portion 110b of the flexible substrate 110), and a region to which stress corresponding to the critical stress CS of the polycrystalline conductive portion 1120 is applied may be a critical line CL. When the critical line CL is located in the second region R2 on which the polycrystalline conductive portion 1120 is disposed, the polycrystalline conductive portion 1120 may be cracked. Accordingly, the critical line CL may be located in the first region R1 on which the columnar conductive portion 1110 is disposed.

The conductive layer 1100 may include metals having, for example, a face centered cubic (FCC) crystalline structure. For example, the conductive layer 1100 may include a metal such as copper (Cu), gold (Au), silver (Ag), aluminum (Al), iron (Fe), nickel (Ni), platinum (Pt), lead (Pb), rhodium (Rh), palladium (Pd), Iridium (Ir), ytterbium (Yb), an alloy thereof, and/or a mixture thereof. Each of the conductive columns 1111 of the columnar conductive portion 1110 may be arranged along a crystallographic {111} plane of the FCC crystalline structure on the upper surface of the flexible substrate 110. Here, arrangement along the crystallographic {111} plane is a surface perpendicular to an extending direction of the conductive columns 1111 corresponds to the crystallographic {111} plane of the FCC crystalline structure. For example, when the conductive columns 1111 are arranged along the crystallographic {111} plane of the FCC crystalline structure, metal elements in the conductive columns 1111 may be densely located. For example, the conductive columns 1111 may have a horizontal cross section in a hexagonal shape.

The columnar conductive portion 1110 and the polycrystalline conductive portion 1120 may be in contact with each other on the third region R3 of the flexible substrate 110 as a concave-convex shape. For example, the polycrystalline conductive portion 1120 may have a recess, and the columnar conductive portion 1110 may have a portion that extends into the recess of the polycrystalline conductive portion 1120. In addition, the columnar conductive portion 1110 may have a recess, and the polycrystalline conductive portion 1120 may have a portion that extends into the recess of the columnar conductive portion 1110. When the columnar conductive portion 1110 and the polycrystalline conductive portion 1120 are in contact with each other as the concave-convex shape, an area of an interface between the columnar conductive portion 1110 and the polycrystalline conductive portion 1120 may increase. Accordingly, an increase of contact resistance between the columnar conductive portion 1110 and the polycrystalline conductive portion 1120, which have different crystalline structures from each other, may be prevented.

The columnar conductive portion 1110 and the polycrystalline conductive portion 1120 may have concave-convex patterns CC1 and CC2, respectively, on the third region R3 of the flexible substrate 110. The concave-convex pattern CC1 of the columnar conductive portion 1110 may have concave portions and convex portions, and the convex portions of the concave-convex pattern CC1 may protrude in the first direction (X direction). The concave-convex pattern CC2 of the polycrystalline conductive portion 1120 may have concave portions and convex portions, and the convex portions of the concave-convex pattern CC2 may protrude in a direction opposite to the first direction (X direction) toward a concave portions of the concave-convex pattern CC1. In addition, the convex portion of the concave-convex pattern CC1 may protrude toward a concave portion of the concave-convex pattern CC2.

Figure 5:
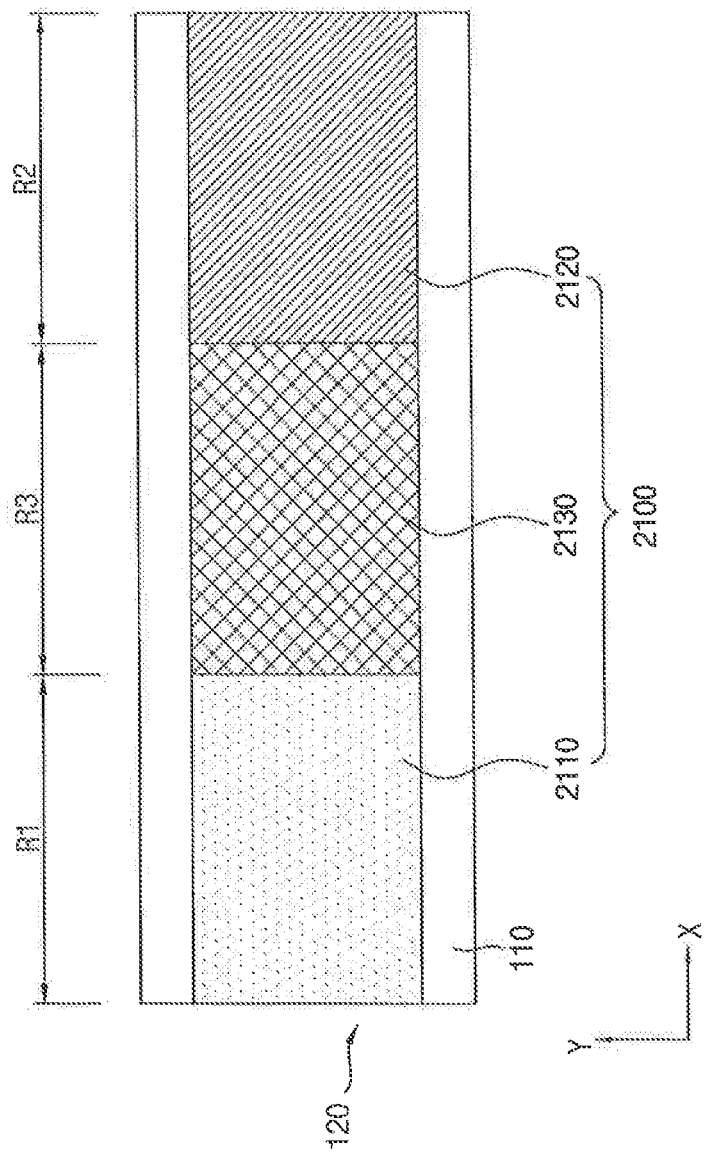
FIG. 5 is a plan view illustrating a flexible display panel according to an exemplary embodiment of the present invention.

FIG. 5 is a plan view illustrating a flexible display panel according to an exemplary embodiment of the present invention.

Referring to FIG. 5, a flexible display panel according to an exemplary embodiment of the present invention may include a flexible substrate 110 and a wiring 120. The wiring 120 may include a conductive layer 2100 disposed on the flexible substrate 110. Descriptions on elements of the flexible display panel according to an exemplary embodiment of the present invention described with reference to FIG. 5, which may be substantially the same as or similar to those of the flexible display panel according to an exemplary embodiment of the present invention described with reference to FIG. 3, may be omitted.

The conductive layer 2100 may include a columnar conductive portion 2110, a polycrystalline conductive portion 2120, and a hybrid conductive portion 2130. The columnar conductive portion 2110 may be disposed on the first region R1 of the flexible substrate 110, the polycrystalline conductive portion 2120 may be disposed on the second region R2 of the flexible substrate 110, and the hybrid conductive portion 2130 may be disposed on the third region R3 of the flexible substrate 110.

The hybrid conductive portion 2130 may include a plurality of conductive columns and a plurality of polycrystalline particles. For example, the hybrid conductive portion 2130 may include the conductive columns constituting the columnar conductive portion 2110 and the polycrystalline particles constituting the polycrystalline conductive portion 2120 together.

A density of the conductive columns of the hybrid conductive portion 2130 may decrease along the first direction (X direction), and a density of the polycrystalline particles of the hybrid conductive portion 2130 may increase along the first direction (X direction). In this case, a density of the conductive columns may be greater than a density of the polycrystalline particles in a portion of the hybrid conductive portion 2130 adjacent to the first region R1, and a density of the polycrystalline particles may be greater than a density of the conductive columns in a portion of the hybrid conductive portion 2130 adjacent to the second region R2. Stress applied to a portion of the third region R3 adjacent to the first region R1 may be greater than stress applied to a portion of the third region R3 adjacent to the second region R2. Accordingly, flexibility may increase in the portion of the hybrid conductive portion 2130 adjacent to the first region R1, and resistance may decrease in the portion of the hybrid conductive portion 2130 adjacent to the second region R2.

Figure 6:
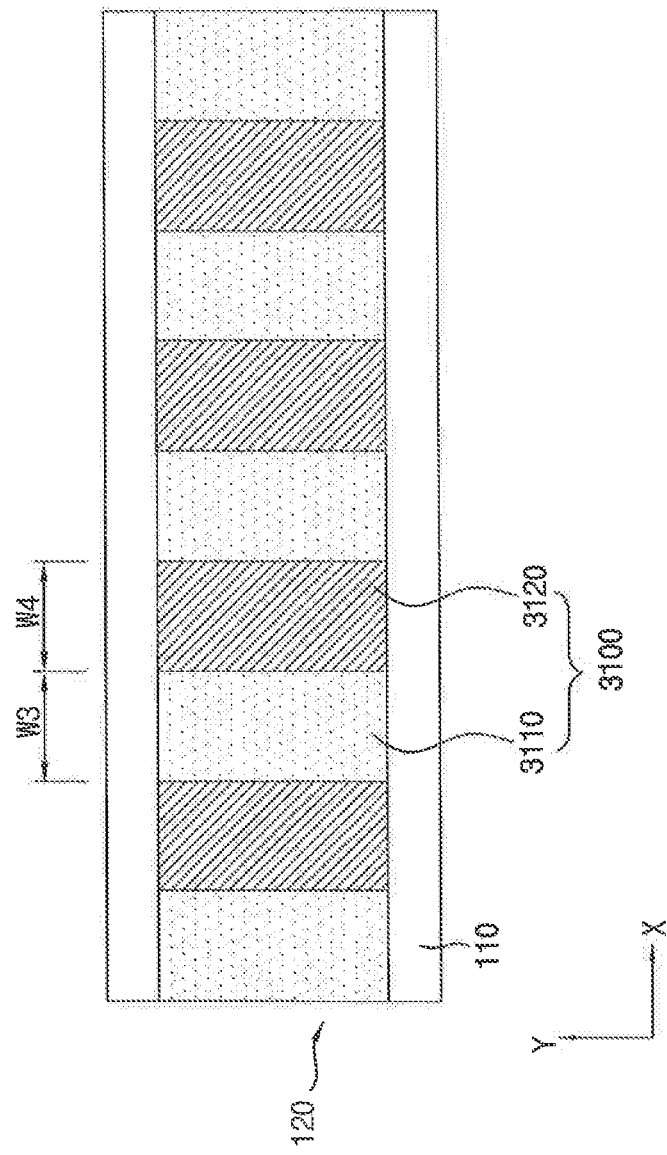
FIG. 6 is a plan view illustrating a flexible display panel according to an exemplary embodiment of the present invention.

FIG. 6 is a plan view illustrating a flexible display panel according to an exemplary embodiment of the present invention.

Referring to FIG. 6, a flexible display panel according to an exemplary embodiment of the present invention may include a flexible substrate 110 and a wiring 120. The wiring 120 may include a conductive layer 3100 disposed on the flexible substrate 110. Descriptions of elements of the flexible display panel according to an exemplary embodiment of the present invention described with reference to FIG. 6, which is substantially the same as or similar to those of the flexible display panel according to an exemplary embodiment of the present invention described with reference to FIG. 3, may be omitted.

The conductive layer 3100 may include a plurality of columnar conductive portions 3110 and a plurality of polycrystalline conductive portions 3120. Each of the columnar conductive portions 3110 may include a plurality of conductive columns. Each of the polycrystalline conductive portions 3120 may include a plurality of polycrystalline particles. The columnar conductive portions 3110 and the polycrystalline conductive portions 3120 may be alternately arranged as, for example, a plurality of alternating stripes. For example, the columnar conductive portions 3110 and the polycrystalline conductive portions 3120 may each have a rectangular shape. For example, one polycrystalline conductive portion 3120 may be disposed between two adjacent columnar conductive portions 3110, and one columnar conductive portion 3110 may be disposed between two adjacent polycrystalline conductive portions 3120.

The columnar conductive portions 3110 and the polycrystalline conductive portions 3120 may be alternately arranged along the first direction (X direction). For example, stress may be applied to the conductive layer 3100 in the first direction (X direction), and interfaces between the columnar conductive portions 3110 and the polycrystalline conductive portions 3120 may extend along the second direction (Y direction) perpendicular to the first direction (X direction). In this case, a transmission and/or a generation of a crack along the first direction (X direction) may be substantially prevented or decreased.

Each of the columnar conductive portions 3110 may have a third width W3, and each of the polycrystalline conductive portions 3120 may have a fourth width W4. The third width W3 of the columnar conductive portions 3110 may extend in a direction in which the columnar conductive portions 3110 are arranged, and the fourth width W4 of the polycrystalline conductive portions 3120 may extend in a direction in which the polycrystalline conductive portions 3120 are arranged.

In an exemplary embodiment of the present invention, the third width W3 may be substantially the same as the fourth width W4. In this case, the columnar conductive portions 3110 and the polycrystalline conductive portions 3120 may be formed by using one mask, so that a cost and a time for the formation of the conductive layer 3100 may be reduced. For example, the columnar conductive portions 3110 may be formed by using a mask, and the polycrystalline conductive portions 3120 may be formed by using the same mask and moving the mask over in the first direction (X direction).

In an exemplary embodiment of the present invention, the third width W3 may be different from the fourth width W4. In this case, a flexibility of the conductive layer 3100 may increase, and/or a resistance of the conductive layer 3100 may decrease by controlling a ratio of the third with W3 to the fourth width W4. For example, when the third width W3 is greater than the fourth width W4, the flexibility of the conductive layer 3100 may increase because areas of the columnar conductive portions 3110 may increase in the conductive layer 3100. Further, when the third width W3 is less than the fourth width W4, the resistance of the conductive layer 3100 may decrease because areas of the polycrystalline conductive portions 3120 may increase in the conductive layer 3100.

Figure 7:
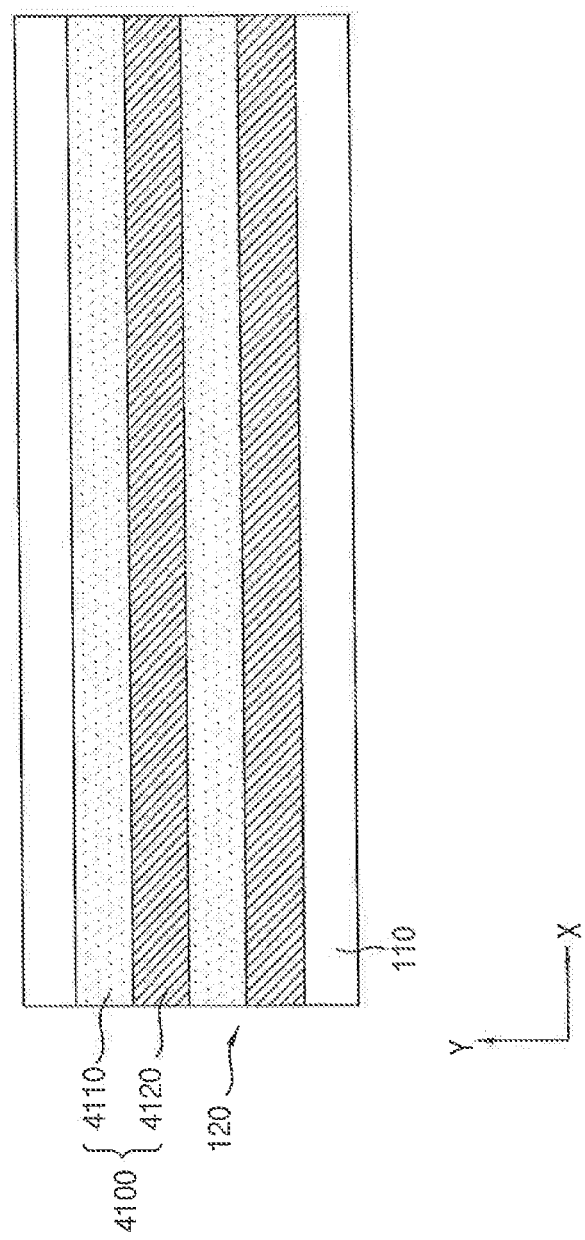
FIG. 7 is a plan view illustrating a flexible display panel according to an exemplary embodiment of the present invention.

FIG. 7 is a plan view illustrating a flexible display panel according to an exemplary embodiment of the present invention.

Referring to FIG. 7, a flexible display panel according to an exemplary embodiment of the present invention may include a flexible substrate 110 and a wiring 120. The wiring 120 may include a conductive layer 4100 disposed on the flexible substrate 110. Descriptions of elements of the flexible display panel according to an exemplary embodiment of the present invention described with reference to FIG. 7, which may be substantially the same as or similar to those of the flexible display panel according to an exemplary embodiment of the present invention described with reference to FIG. 6, may be omitted.

The columnar conductive portions 4110 and the polycrystalline conductive portions 4120 may be alternately arranged along the second direction (Y direction) perpendicular to the first direction (X direction) and alternately arranged in parallel with the flexible substrate 110. For example, the columnar conductive portions 4110 and the polycrystalline conductive portions 4120 may extend in the first direction (X direction). In contrast to the flexible display panel according to an exemplary embodiment of the present invention described with reference to FIG. 6, in which interfaces between the columnar conductive portions 4110 and the polycrystalline conductive portions 4120 may extend in parallel with the first direction (X direction).

Hereinafter, cross-sectional structures of flexible display panels according to exemplary embodiments of the present invention will be described with reference to FIGS. 8, 10, and 11.

Figure 8:
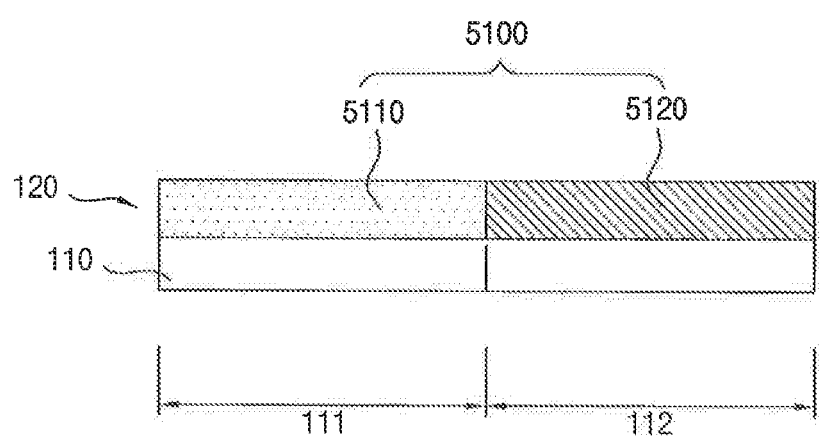
FIG. 8 is a cross-sectional view illustrating a flexible display panel according to an exemplary embodiment of the present invention.

FIG. 8 is a cross-sectional view illustrating a flexible display panel according to an exemplary embodiment of the present invention.

Referring to FIG. 8, a flexible display panel according to an exemplary embodiment of the present invention may include a flexible substrate 110 and a wiring 120. The wiring 120 may include a conductive layer 5100 disposed on the flexible substrate 110.

The flexible substrate 110 may be formed of, for example, polyester, polyimide, polyethylene terephthalate (PET), polydimethylsiloxane (PDMS), or the like. The flexible substrate 110 may include a first region 111 and a second region 112.

The conductive layer 5100 may include a columnar conductive portion 5110 and a polycrystalline conductive portion 5120. The columnar conductive portion 5110 may be disposed on the first region 111 of the flexible substrate 110, and the polycrystalline conductive portion 5120 may be disposed on the second region 112 of the flexible substrate 110. The columnar conductive portion 5110 may correspond to the columnar conductive portion 1110 in FIG. 3, the columnar conductive portion 2110 in FIG. 5, the columnar conductive portion 3110 in FIG. 6, and the columnar conductive portion 4110 in FIG. 7. Further, the polycrystalline conductive portion 5120 may correspond to the polycrystalline conductive portion 1120 in FIG. 3, the polycrystalline conductive portion 2120 in FIG. 5, the polycrystalline conductive portion 3120 in FIG. 6, and the polycrystalline conductive portion 4120 in FIG. 7.

In an exemplary embodiment of the present invention, the flexible substrate 110 may further include a third region located between the first region 111 and the second region 112, and the conductive layer 5100 may further include a hybrid conductive portion disposed on the third region. In this case, the hybrid conductive portion may correspond to the hybrid conductive portion 2130 in FIG. 5.

Hereinafter, a method of manufacturing a flexible display panel according to an exemplary embodiment of the present invention will be described with reference to FIG. 8.

First, the flexible substrate 110 may be disposed inside a chamber. The flexible substrate 110 may be formed of, for example, polyester, polyimide, polyethylene terephthalate, polydimethylsiloxane, or the like as described above. In an exemplary embodiment of the present invention, pretreatments (e.g., cleaning, surface treatment, etc.) of the flexible substrate 110 may be performed before disposing the flexible substrate 110 inside the chamber.

Then, the conductive layer 5100 may be formed on the flexible substrate 110. The conductive layer 5100 may be formed by, for example, a sputtering method, a chemical vapor deposition (CVD) method, a low pressure CVD (LPCVD) method, a plasma enhanced CVD (PECVD) method, a metal-organic CVD method, an atomic layer deposition (ALD) method, a metal-organic ALD method, an e-beam evaporation method, a molecular beam epitaxy (MBE) method, or the like.

In an exemplary embodiment of the present invention, the conductive layer 5100 may be formed on the flexible substrate 110 by the sputtering method. For example, the sputtering method may be performed by using an inert gas such as argon (Ar), etc. as a processing gas. The sputtering method may further be performed by using a copper (Cu) target and controlling a magnitude of deposition power.

Figure 9:
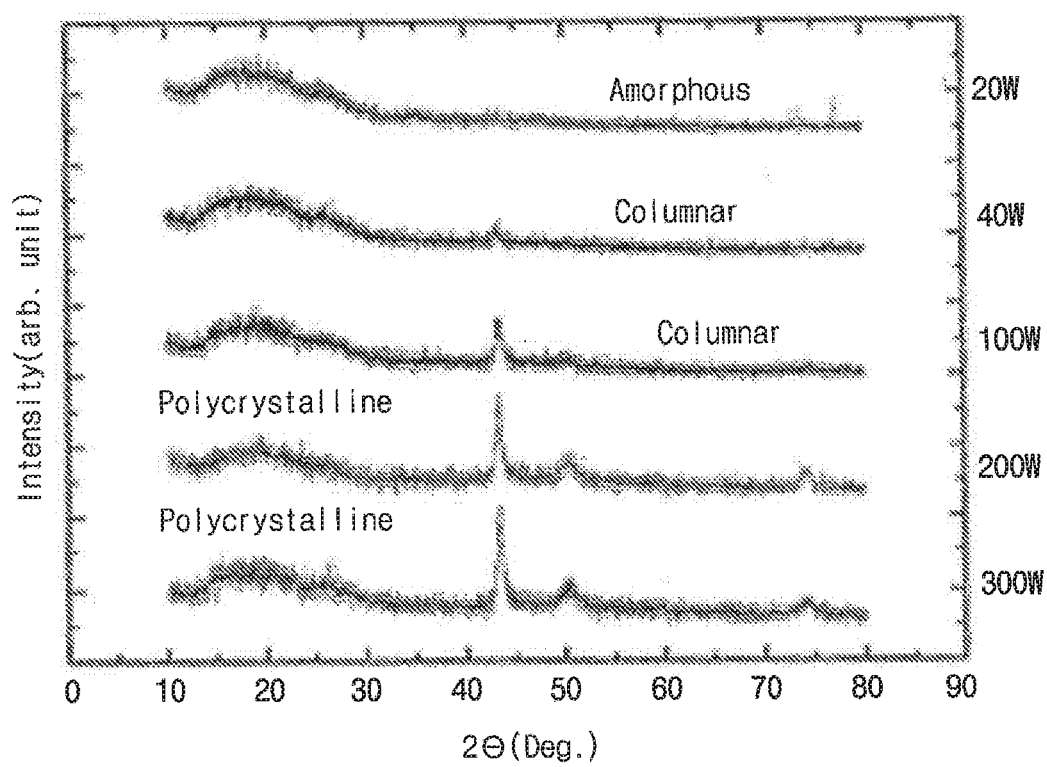
FIG. 9 is a diffraction analysis pattern of a conductive layer manufactured according to a magnitude of power.

FIG. 9 is a diffraction analysis pattern of a conductive layer manufactured according to a magnitude of power.

Referring to FIG. 9, a conductive layer including conductive columns may be formed when the deposition power is in a range from about 40 W to about 100 W, and a conductive layer including a polycrystalline structure may be formed when the deposition power is in a range from about 200 W to about 300 W. A conductive layer including an amorphous structure may be formed when the deposition power is about 20 W.

Referring to FIG. 8 again, the columnar conductive portion 5110 including conductive columns may be formed on the first region 111 of the flexible substrate 110, and the polycrystalline conductive portion 5120 including polycrystalline particles may be formed on the second region 112 of the flexible substrate 110. In an exemplary embodiment of the present invention, the polycrystalline conductive portion 5120 may be formed after the formation of the columnar conductive portion 5110. In an exemplary embodiment of the present invention, the columnar conductive portion 5110 may be formed after the formation of the polycrystalline conductive portion 5120.

In an exemplary embodiment of the present invention, the columnar conductive portion 5110 and the polycrystalline conductive portion 5120 may be formed at substantially the same time.

The columnar conductive portion 5110 may be formed by using a first power, and the polycrystalline conductive portion 5120 may be formed by using a second power greater than the first power. For example, the first power may be in a range from about 40 W to about 100 W, and the second power may be in a range from about 200 W to about 300 W. For example, the columnar conductive portion 5110 may be formed on the first region 111 of the flexible substrate 110 by using the first power, and then, the polycrystalline conductive portion 5120 may be formed on the second region 112 of the flexible substrate 110 by increasing the deposition power from the first power to the second power.

In an exemplary embodiment of the present invention, the flexible substrate 110 may further include a third region located between the first region 111 and the second region 112, and a hybrid conductive portion including conductive columns and polycrystalline particles may be further formed on the third region. In this case, the hybrid conductive portion may correspond to the hybrid conductive portion 2130 in FIG. 5. The hybrid conductive portion may be formed by using a third power greater than the first power and less than the second power. For example, the third power may be in a range from about 100 W to about 200 W.

Figure 10:
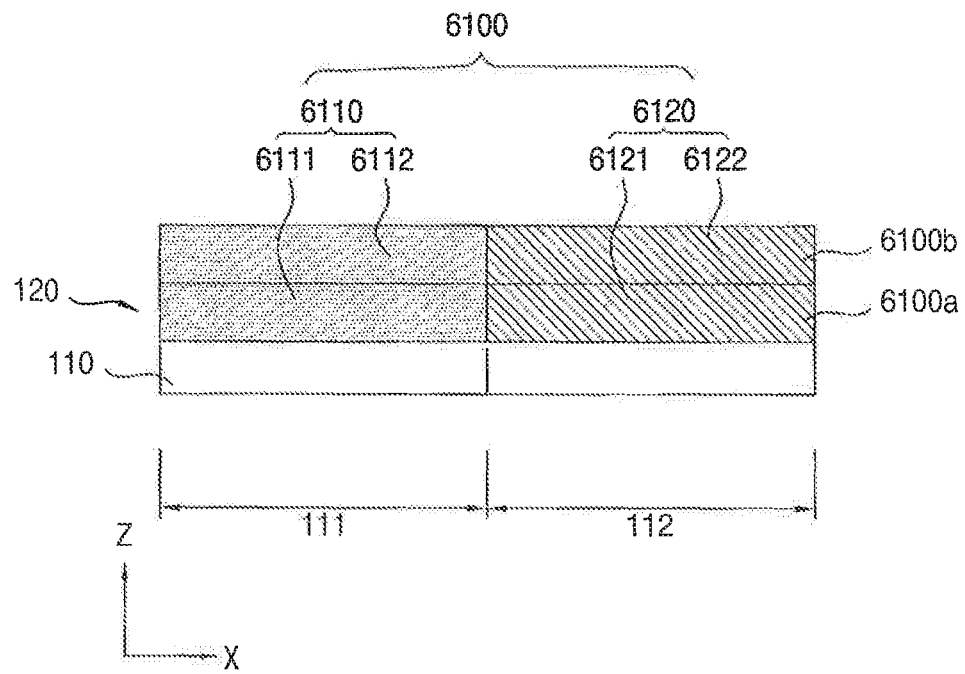
FIG. 10 is a cross-sectional view illustrating a flexible display panel according to an exemplary embodiment of the present invention.

FIG. 10 is a cross-sectional view illustrating a flexible display panel according to an exemplary embodiment of the present invention.

Referring to FIG. 10, a flexible display panel according to an exemplary embodiment of the present invention may include a flexible substrate 110 and a wiring 120. The wiring 120 may include a conductive layer 6100 disposed on the flexible substrate 110. Descriptions of elements of the flexible display panel according to an exemplary embodiment of the present invention described with reference to FIG. 10, which may be substantially the same as or similar to those of the flexible display panel according to an exemplary embodiment of the present invention described with reference to FIG. 8, may be omitted.

The conductive layer 6100 may include a columnar conductive portion 6110 and a polycrystalline conductive portion 6120. The columnar conductive portion 6110 may include a first sub-columnar conductive portion 6111 disposed on the first region 111 of the flexible substrate 110 and a second sub-columnar conductive portion 6112 disposed on the first sub-columnar conductive portion 6111. The polycrystalline conductive portion 6120 may include a first sub-polycrystalline conductive portion 6121 disposed on the second region 112 of the flexible substrate 110 and a second sub-polycrystalline conductive portion 6122 disposed on the first sub-polycrystalline conductive portion 6121. A height of the first sub-columnar conductive portion 6111 and a height of the second sub-columnar conductive portion 6112 may be substantially the same as a height of the first sub-polycrystalline conductive portion 6121 and a height of the second sub-polycrystalline conductive portion 6122, respectively. For example, the columnar conductive portion 6110 may be substantially the same height as that of the polycrystalline conductive portion 6120. In this case, a first sub-conductive layer 6100*a* including the first sub-columnar conductive portion 6111 and the first sub-polycrystalline conductive portion 6121, and a second sub-conductive layer 6100*b* including the second sub-columnar conductive portion 6112 and the second sub-polycrystalline conductive portion 6122 may be formed.

The first sub-conductive layer 6100*a* and the second sub-conductive layer 6100*b* may be separately formed, therefore, an interface may be formed between the first sub-conductive layer 6100*a* and the second sub-conductive layer 6100*b*. Stress may be applied to the conductive layer 6100 in the third direction (Z direction), and the interface between the first sub-conductive layer 6100a and the second sub-conductive layer 6100b may extend along the first direction (X direction) perpendicular to the third direction (Z direction). In this case, a transmission and/or a generation of a crack along the third direction (Z direction) may be substantially prevented or decreased.

In addition, even though FIG. 10 illustrates two sub-conductive layers, the present invention is not limited thereto. For example, the present invention may include more than two sub-conductive layers.

Figure 11:
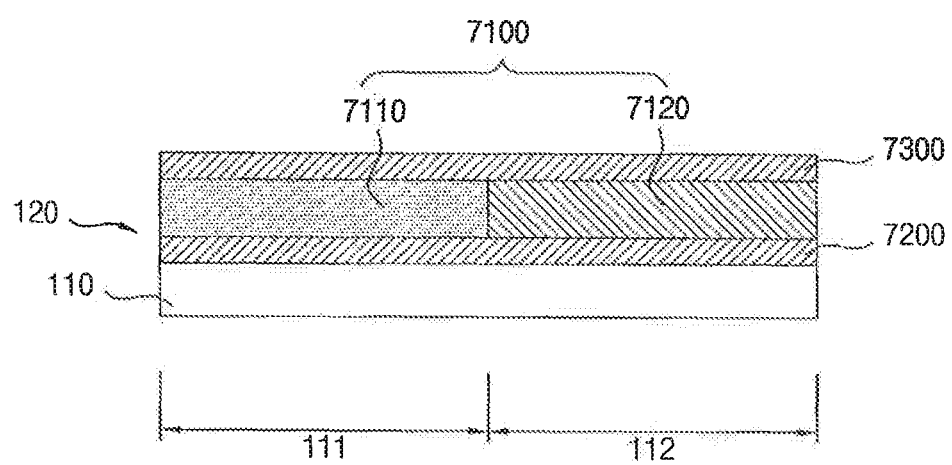
FIG. 11 is a cross-sectional view illustrating a flexible display panel according to an exemplary embodiment of the present invention.

FIG. 11 is a cross-sectional view illustrating a flexible display panel according to an exemplary embodiment of the present invention.

Referring to FIG. 11, a flexible display panel according to an exemplary embodiment of the present invention may include a flexible substrate 110 and a wiring 120. The wiring 120 may include a conductive layer 7100 disposed on the flexible substrate 110. The wiring 120 may further include a first auxiliary conductive layer 7200 and a second auxiliary conductive layer 7300. Descriptions of elements of the flexible display panel according to an exemplary embodiment of the present invention described with reference to FIG. 11, which may be substantially the same as or similar to those of the flexible display panel according to an exemplary embodiment of the present invention described with reference to FIG. 8, may be omitted.

The first auxiliary conductive layer 7200 may be disposed between the flexible substrate 110 and the conductive layer 7100, and the second auxiliary conductive layer 7300 may be disposed on the conductive layer 7100. For example, the first auxiliary conductive layer 7200 may cover an upper surface of the conductive layer 7100, and the second auxiliary conductive layer 7300 may cover a lower surface of the conductive layer 7100. The first auxiliary conductive layer 7200 and the second auxiliary conductive layer 7300 may prevent a hillock or a bulge that can be generated on a surface of the conductive layer 7100 during a manufacturing process of the flexible display panel. For example, the first auxiliary conductive layer 7200 and the second auxiliary conductive layer 7300 may be formed of titanium (Ti), molybdenum (Mo), or the like. For example, the wiring 120 may have a Ti/Al/Ti structure or a Mo/Al/Mo structure.

Figure 12A:
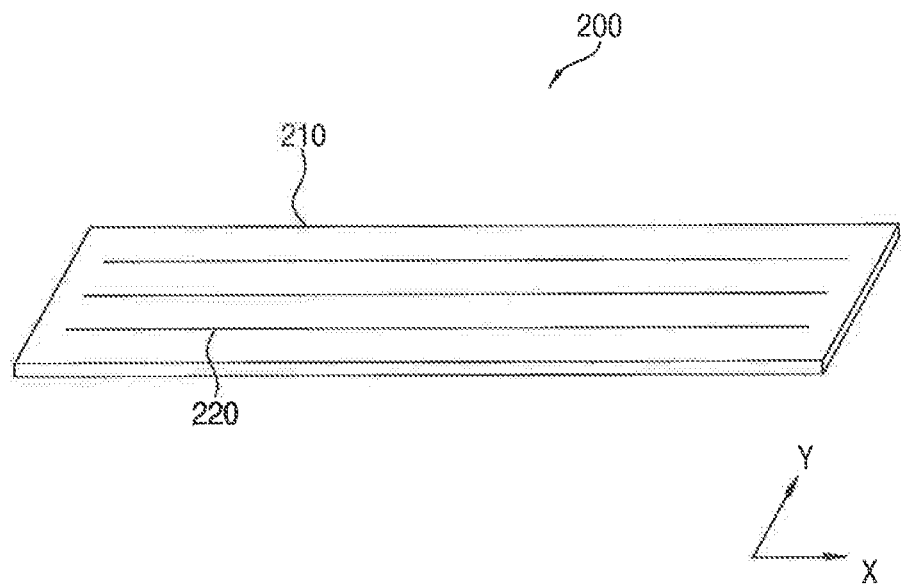
FIGS. 12A and 12B are perspective views illustrating a bendable display device including a flexible display panel according to an exemplary embodiment of the present invention.
Figure 12B:
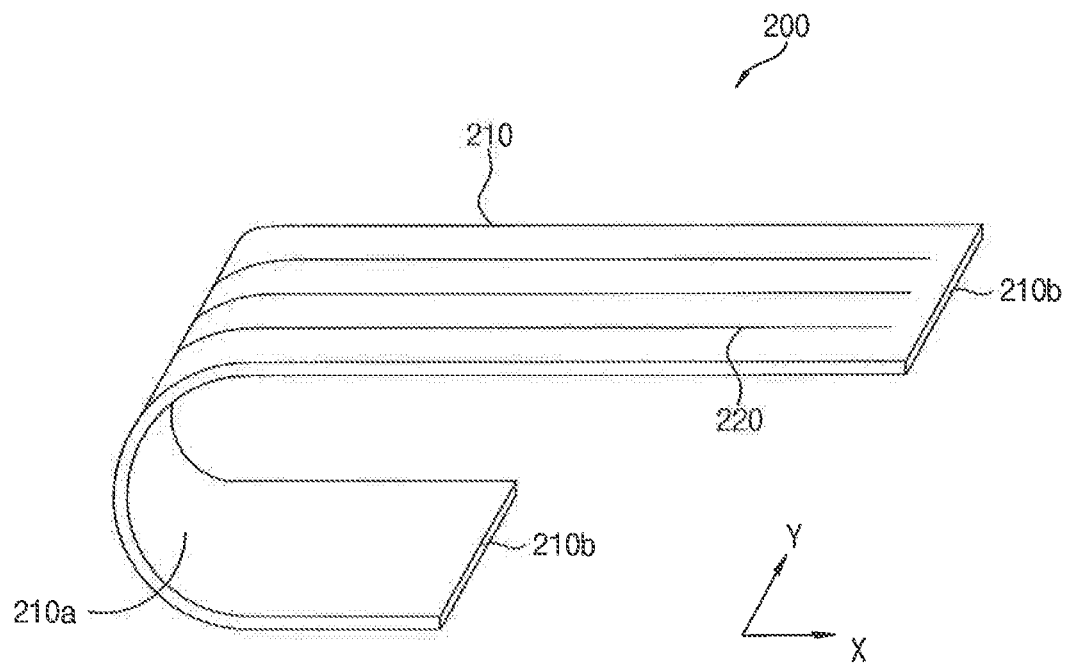

FIGS. 12A and 12B are perspective views illustrating a bendable display device including a flexible display panel according to an exemplary embodiment of the present invention. FIG. 12A illustrates the flexible display panel in an unbent state, and FIG. 12B illustrates the flexible display panel in a bent state.

Referring to FIGS. 12A and 12B, a flexible display panel 200 according to an exemplary embodiment of the present invention may include a flexible substrate 210 and a wiring 220 disposed on the flexible substrate 210. Descriptions of elements of the flexible display panel according to an exemplary embodiment of the present invention described with reference to FIGS. 12A and 12B, which may be substantially the same as or similar to those of the flexible display panel according to an exemplary embodiment of the present invention described with reference to FIGS. 1A and 1B, may be omitted.

The flexible display panel 200 may be bent around a bending axis. In this case, the flexible display panel 200 may be applied to a bendable display device. The bending axis may be in parallel with the flexible substrate 210 (e.g., with the width of the flexible substrate 210) and in parallel with the second direction (Y direction) perpendicular to the first direction (X direction). In the flexible substrate 210, a central portion 210a adjacent to the bending axis and outer portions 210b spaced apart from the bending axis may be provided. When the flexible display panel 200 is bent around the bending axis, stress may be applied to the flexible display panel 200 in the first direction (X direction) and in a direction (−X direction) opposite to the first direction.

Figure 13A:
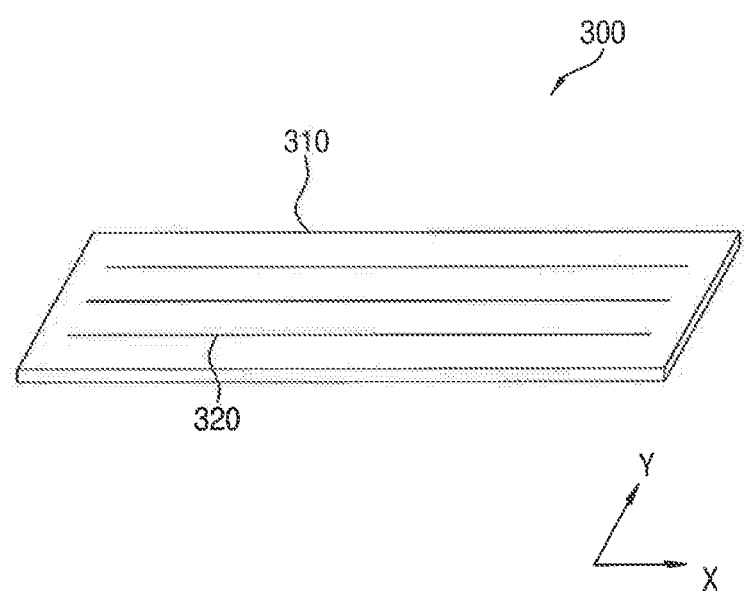
FIGS. 13A and 13B are perspective views illustrating a stretchable display device including a flexible display panel according to an exemplary embodiment of the present invention.
Figure 13B:
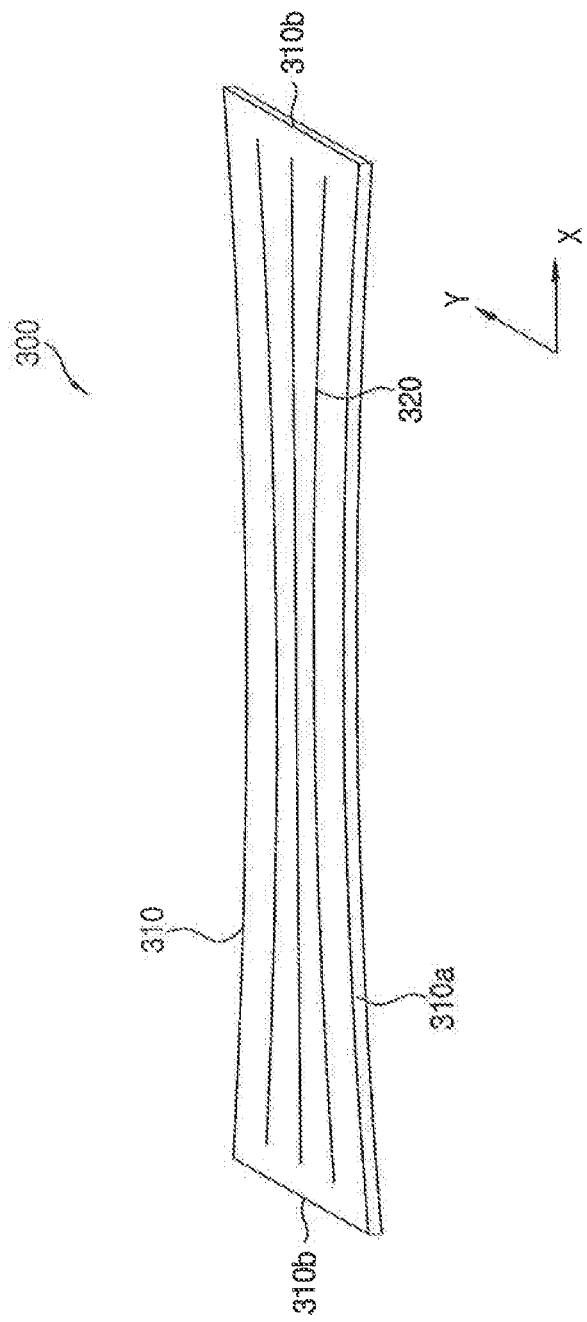

FIGS. 13A and 13B are perspective views illustrating a stretchable display device including a flexible display panel according to an exemplary embodiment of the present invention. FIG. 13A illustrates the flexible display panel to which stress is not applied, and FIG. 13B illustrates the flexible display panel in a stretched state to which tensile stress is applied.

Referring to FIGS. 13A and 13B, a flexible display panel 300 according to an exemplary embodiment of the present invention may include a flexible substrate 310 and a wiring 320 disposed on the flexible substrate 310. Descriptions of elements of the flexible display panel according to an exemplary embodiment of the present invention described with reference to FIGS. 13A and 13B, which may be substantially the same as or similar to those of the flexible display panel according to an exemplary embodiment of the present invention described with reference to FIGS. 1A and 1B, may be omitted.

The flexible display panel 300 may be stretched to the first direction (X direction) and to a direction (−X direction) opposite to the first direction. In this case, the flexible display panel 300 may be applied to a stretchable display device. The flexible substrate 310 includes a central portion 310a located at the vicinity of a center of the flexible substrate 310 and outer portions 310b located at opposite ends of the flexible substrate 310. When the flexible display panel 300 is stretched to the first direction (X direction) and to a direction (−X direction) opposite to the first direction, stress may be applied to the flexible display panel 300 in the first direction (X direction) and in a direction (−X direction) opposite to the first direction.

Figure 14:
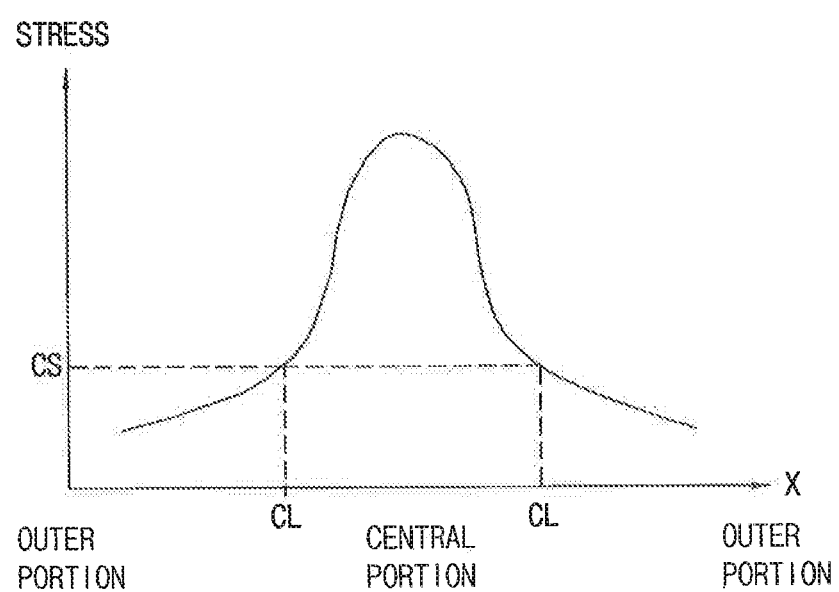
FIG. 14 is a graph illustrating a magnitude of stress applied to a wiring along a X direction in FIGS. 12A and 12B.

FIG. 14 is a graph illustrating a magnitude of stress applied to a wiring along a X direction in FIGS. 12A and 12B.

Referring to FIGS. 12A, 12B, and 14, stress may be applied to the wiring 220 in the first direction (X direction) and in a direction (−X direction) opposite to the first direction when the flexible display panel 200 is bent around the bending axis. A magnitude of the stress applied to the wiring 220 may be different along the first direction (X direction). As illustrated in FIG. 14, the magnitude of the stress applied to the wiring 220 may decrease along the first direction (X direction) and along a direction (−X direction) opposite to the first direction. The magnitude of the stress applied to the wiring 220 may increase as approaching the central portion 210a of the flexible substrate 210, and may decrease as approaching the outer portions 210b of the flexible substrate 210. The graph in FIG. 14 may also be applied to the wiring 320 in FIGS. 13A and 13B.

FIG. 15 is a plan view illustrating a flexible display panel according to an exemplary embodiment of the present invention.

Referring to FIG. 15, a flexible display panel according to an exemplary embodiment of the present invention may include a flexible substrate 210 and a wiring 220. The wiring 220 may include a conductive layer 8100 disposed on the flexible substrate 210. Descriptions of elements of the flexible display panel according to an exemplary embodiment of the present invention described with reference to FIG. 15, which may substantially the same as or similar to those of the flexible display panel according to an exemplary embodiment of the present invention described with reference to FIG. 5, may be omitted.

The flexible substrate 210 may include a first region R1, two second regions R2, and two third regions R3. The two second regions R2 may be located in the first direction (X direction) and in a direction (−X direction) opposite to the first direction, respectively, from the first region R1. For example, the first region R1 may be located between the two second regions R2. One of the third regions R3 may be located between the first region R1 and one of the second regions R2, and the other of the third regions R3 may be located between the first region R1 and the other of the second regions R2. For example, the first region R1 may be adjacent to the central portion 210a of the flexible substrate 210, and the second regions R2 may be adjacent to the outer portions 210b of the flexible substrate 210. The flexible display panel according to an exemplary embodiment of the present invention with reference to FIG. 15 may also be applied to the stretchable display device in FIGS. 13A and 13B.

The flexible display panel, according to the exemplary embodiments of the present invention, may be applied to a display device included in a computer, a notebook, a mobile phone, a smartphone, a smart pad, a portable media player (PMP), a personal digital assistant (PDA), an MP3 player, or the like.

While the present invention has been described with reference to exemplary embodiments thereof, it will be understood by those of ordinary skill in the art that various changes in form and details may be made thereto without departing from the spirit and scope of the present invention as defined by the following claims.

What is claimed is:

1. A flexible display panel, comprising:
a flexible substrate including a first region configured to receive a first stress and a second region configured to receive a second stress less than the first stress, wherein the second region is located in a first direction from the first region; and
a conductive layer including a columnar conductive portion and a polycrystalline conductive portion, wherein the columnar conductive portion is disposed on the first region of the flexible substrate and includes conductive columns, and the polycrystalline conductive portion is disposed on the second region of the flexible substrate and includes polycrystalline particles.

2. The flexible display panel of claim 1, wherein the flexible substrate further includes a third region configured to receive a third stress less than the first stress and greater than the second stress, wherein the third region is located between the first region and the second region, and
wherein the columnar conductive portion and the polycrystalline conductive portion are in contact with each other on the third region of the flexible substrate, wherein the columnar conductive portion is configured to receive the polycrystalline conductive portion, and the polycrystalline conductive portion is configured to receive the columnar conductive portion.

3. The flexible display panel of claim 2, wherein a concave-convex pattern of the columnar conductive portion protrudes in the first direction on the third region, and
wherein a concave-convex pattern of the polycrystalline conductive portion protrudes in a direction opposite to the first direction and toward the columnar conductive portion on the third region.

4. The flexible display panel of claim 1, wherein the flexible substrate further includes a third region configured to receive a third stress less than the first stress and greater than the second stress, wherein the third region is located between the first region and the second region, and
wherein the conductive layer further includes a hybrid conductive portion disposed on the third region of the flexible substrate, wherein the hybrid conductive portion includes conductive columns and polycrystalline particles.

5. The flexible display panel of claim 4, wherein a density of the conductive columns of the hybrid conductive portion decreases along the first direction, and
wherein a density of the polycrystalline particles of the hybrid conductive portion increases along the first direction.

6. The flexible display panel of claim 1, wherein the second stress is less than a critical stress of the polycrystalline conductive portion.

7. The flexible display panel of claim 1, wherein the conductive layer includes a metal having a face centered cubic (FCC) crystal structure.

8. The flexible display panel of claim 1, further comprising:
a first auxiliary conductive layer disposed between the flexible substrate and the conductive layer; and
a second auxiliary conductive layer disposed on the conductive layer.

9. A flexible display panel, comprising:
a flexible substrate; and
a conductive layer disposed on the flexible substrate and including a plurality of columnar conductive portions and a plurality of polycrystalline conductive portions, wherein each of the plurality of columnar conductive portions includes conductive columns, and each of the plurality of polycrystalline conductive portions includes polycrystalline particles,
wherein the plurality of columnar conductive portions and the plurality of polycrystalline conductive portions are alternately arranged.

10. The flexible display panel of claim 9, wherein the plurality of columnar conductive portions and the plurality of polycrystalline conductive portions are alternately arranged along a first direction, wherein the first direction extends along a length of the flexible substrate.

11. The flexible display panel of claim 9, wherein the plurality of columnar conductive portions and the plurality of polycrystalline conductive portions are alternately arranged along a second direction, wherein the second direction extends along a width of the flexible substrate.

12. The flexible display panel of claim 9, wherein a width of each columnar conductive portion of the plurality of columnar conductive portions is substantially the same as a width of each polycrystalline conductive portion of the plurality of polycrystalline conductive portions.

13. The flexible display panel of claim 9, wherein a width of each columnar conductive portion of the plurality of columnar conductive portions is different from a width of each polycrystalline conductive portion of the plurality of polycrystalline conductive portions.

14. The flexible display panel of claim 9, wherein the conductive layer includes a first sub-conductive layer disposed on the flexible substrate and a second sub-conductive layer disposed on the first sub-conductive layer.

* * * * *